United States Patent
Ting et al.

(10) Patent No.: US 8,754,656 B2
(45) Date of Patent: Jun. 17, 2014

(54) HIGH SPEED TEST CIRCUIT AND METHOD

(75) Inventors: Tah-Kang Ting, Taipei (TW); Gyh-Bin Wang, Hsinchu (TW); Ming-Hung Wang, Hsinchu (TW); Chun-Peng Wu, Hsinchu (TW); Li-Chin Tien, Hsinchu (TW)

(73) Assignee: Piecemakers Technology, Incorporation, Cyonglin Township, Hsin-Chu (TW)

( * ) Notice: Subject to any disclaimer, the term of this patent is extended or adjusted under 35 U.S.C. 154(b) by 343 days.

(21) Appl. No.: 13/410,472

(22) Filed: Mar. 2, 2012

(65) Prior Publication Data

US 2012/0229146 A1 Sep. 13, 2012

(30) Foreign Application Priority Data

Mar. 11, 2011 (TW) .............................. 100108363 A

(51) Int. Cl.
| | |
|---|---|
| G01R 27/28 | (2006.01) |
| G11C 29/10 | (2006.01) |
| G06F 11/00 | (2006.01) |
| G01R 31/3193 | (2006.01) |
| G11C 29/50 | (2006.01) |
| G11C 29/02 | (2006.01) |
| G01R 31/317 | (2006.01) |

(52) U.S. Cl.
CPC .... *G01R 31/31932* (2013.01); *G11C 29/50012* (2013.01); *G11C 29/022* (2013.01); *G01R 31/31727* (2013.01)
USPC .......................... 324/617; 714/744; 365/201

(58) Field of Classification Search
CPC .................. G01R 31/31932; G01R 31/31727; G11C 29/50012; G11C 29/022
See application file for complete search history.

(56) References Cited

U.S. PATENT DOCUMENTS

| | | | | |
|---|---|---|---|---|
| 4,670,878 | A * | 6/1987 | Childers | 365/201 |
| 5,629,946 | A * | 5/1997 | Takano | 714/738 |
| 5,928,373 | A * | 7/1999 | Yoo | 714/719 |
| 7,793,174 | B2 * | 9/2010 | Hattori et al. | 324/762.06 |
| 2004/0044491 | A1 * | 3/2004 | Yonaga et al. | 702/118 |
| 2007/0245200 | A1 * | 10/2007 | Hattori et al. | 714/742 |

* cited by examiner

*Primary Examiner* — Jermele M Hollington
(74) *Attorney, Agent, or Firm* — Tung & Associates

(57) ABSTRACT

A high speed test circuit receives a tester clock from a tester and it conducts a test on a circuit under test. The high speed test circuit generates a high frequency clock according to the tester clock, so it is capable of operating in two frequencies. The high speed test circuit tests the circuit under test according to the high frequency clock, and it performs a low speed operation according to a low frequency clock, which is for example the tester clock.

24 Claims, 5 Drawing Sheets

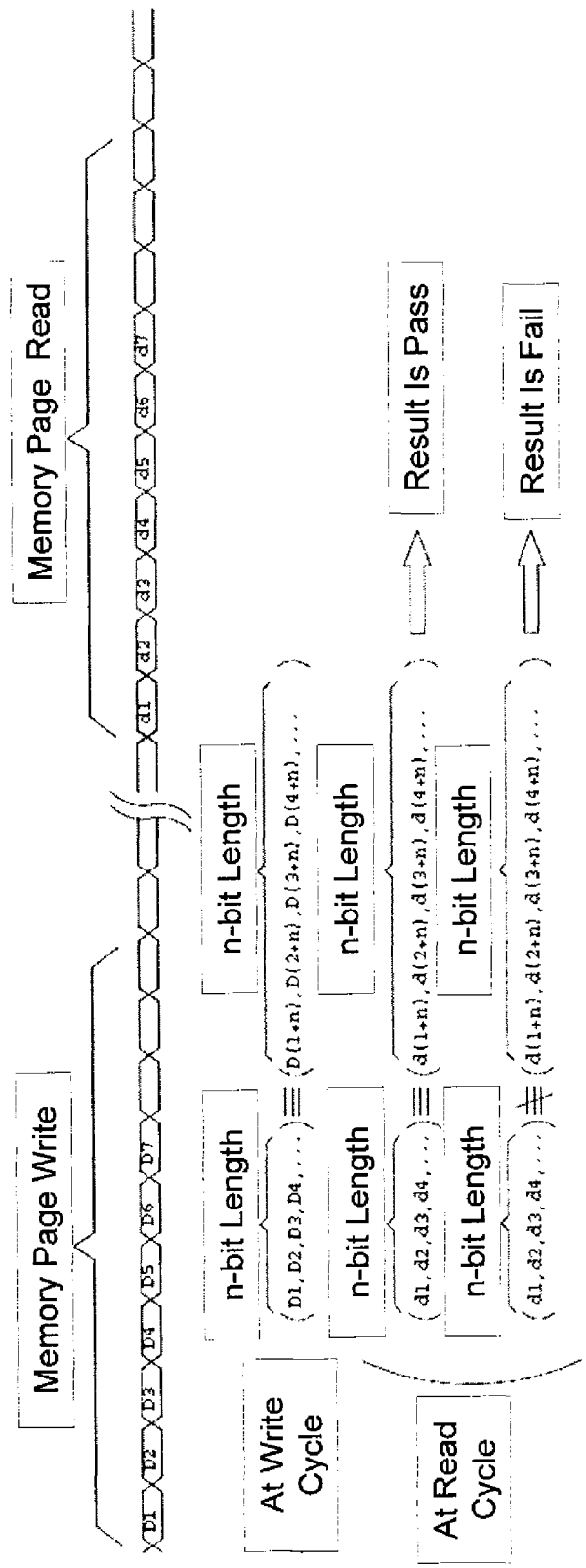
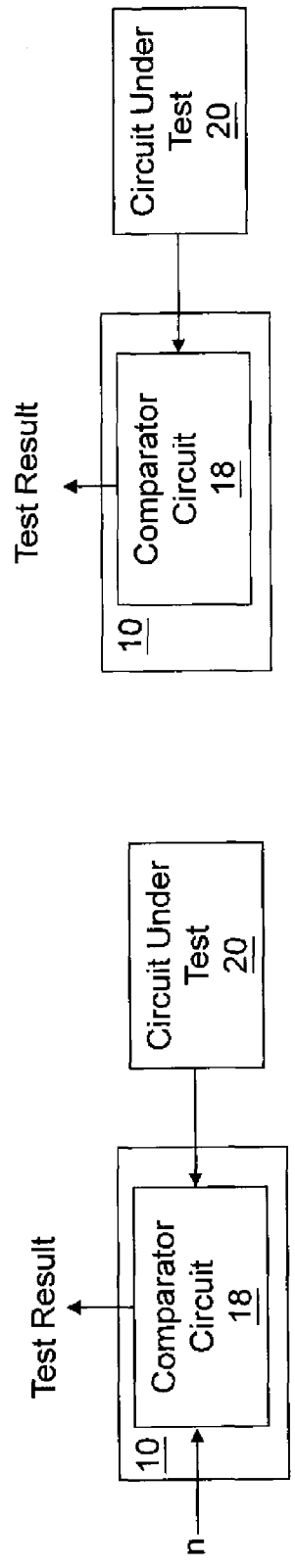
Fig. 5
Fig. 6A
Fig. 6B

HIGH SPEED TEST CIRCUIT AND METHOD

CROSS REFERENCE

The present invention claims priority to TW100108363, filed on Mar. 11, 2011.

BACKGROUND OF THE INVENTION

1. Field of Invention

The present invention relates to a high speed test circuit and a method, in particular to an embedded high speed test circuit and a method capable of improving the test speed so that they are not limited by the tester frequency. They are particularly suitable to the test of memory ICs such as DRAMs (Dynamic Random Access Memory).

2. Description of Related Art

In prior art chip tests (particularly in the wafer level tests), a tester generates test clocks and test patterns which are inputted to the chips through their pins, and the test results responsive to the test patterns are outputted from the chips to the tester to confirm whether the chips are qualified.

The above prior art method has the drawbacks that the test speed is limited by the frequency of the clock cycles generated by the tester, and that the transmission lines from the tester to the chips also negatively affect the test speed, because the tester needs to send the test signals to the chips through high-load connection lines.

The present invention overcomes the foregoing drawbacks by providing an embedded high speed test circuit and a corresponding method so that a low-speed tester can conduct a high speed test on a high speed chip (e.g., a RAM, random access memory).

SUMMARY OF THE INVENTION

An objective of the present invention is to provide a high speed test circuit capable of conducting a high speed test on a high speed chip. The high speed test circuit can be embedded in the chip under test.

Another objective of the present invention is to provide a high speed test method.

To achieve the foregoing objectives, in one aspect, the present invention provides a high speed test circuit receiving a tester clock from a tester for conducting a test on a circuit under test. The high speed test circuit comprises: an N-fold frequency multiplier circuit for receiving the tester clock and generating an N-fold frequency clock, wherein N is a positive real number; a test clock generator for generating a test clock according to the N-fold frequency clock and the tester clock, wherein the test clock is switchable between a high frequency (high frequency test clock) and a low frequency (low frequency test clock); a test signal generator operating under the test clock for generating a test signal to be sent to the circuit under test; and a comparator circuit comparing the test signal from the test signal generator with a response signal provided by the circuit under test in response to the test signal, to generate a comparison result, wherein the high speed test circuit tests the circuit under test according to the high frequency test clock, and performs a low speed operation according to the low frequency test clock.

In another aspect, the present invention provides a high speed test method for conducting a test on a circuit under test, the method comprising: receiving a tester clock from a tester; generating an N-fold frequency clock according to the tester clock, wherein N is a positive real number; generating a test clock according to the N-fold frequency clock and the tester clock, wherein the test clock is switchable between a high frequency (high frequency test clock) and a low frequency (low frequency test clock); generating a test signal according to the frequency of the test clock; sending the test signal to the circuit under test for obtaining a response signal provided by the circuit under test in response to the test signal; and generating a test result according to the response signal.

In one embodiment of the high speed test circuit and the method, two test clocks are generated, with a delay time in between; the test signal is generated according to one of the test clocks, and the circuit under test samples the test signal according to the other one of the test clocks.

In one embodiment of the high speed test circuit and the method, the low frequency test clock has the same frequency as the tester clock, and the high frequency test clock has the same frequency a the N-fold frequency clock.

In one embodiment of the high speed test circuit and the method, a command is received from the tester, and the command is transferred to a high frequency signal in due course.

The objectives, technical details, features, and effects of the present invention will be better understood with regard to the detailed description of the embodiments below, with reference to the drawings.

BRIEF DESCRIPTION OF THE DRAWINGS

FIG. 5 shows a schematic diagram illustrating data comparison process of the present invention.

FIGS. 6A-6B show two embodiments of the data comparison process executed by the comparator circuit 18.

DESCRIPTION OF THE PREFERRED EMBODIMENTS

Figure 1:
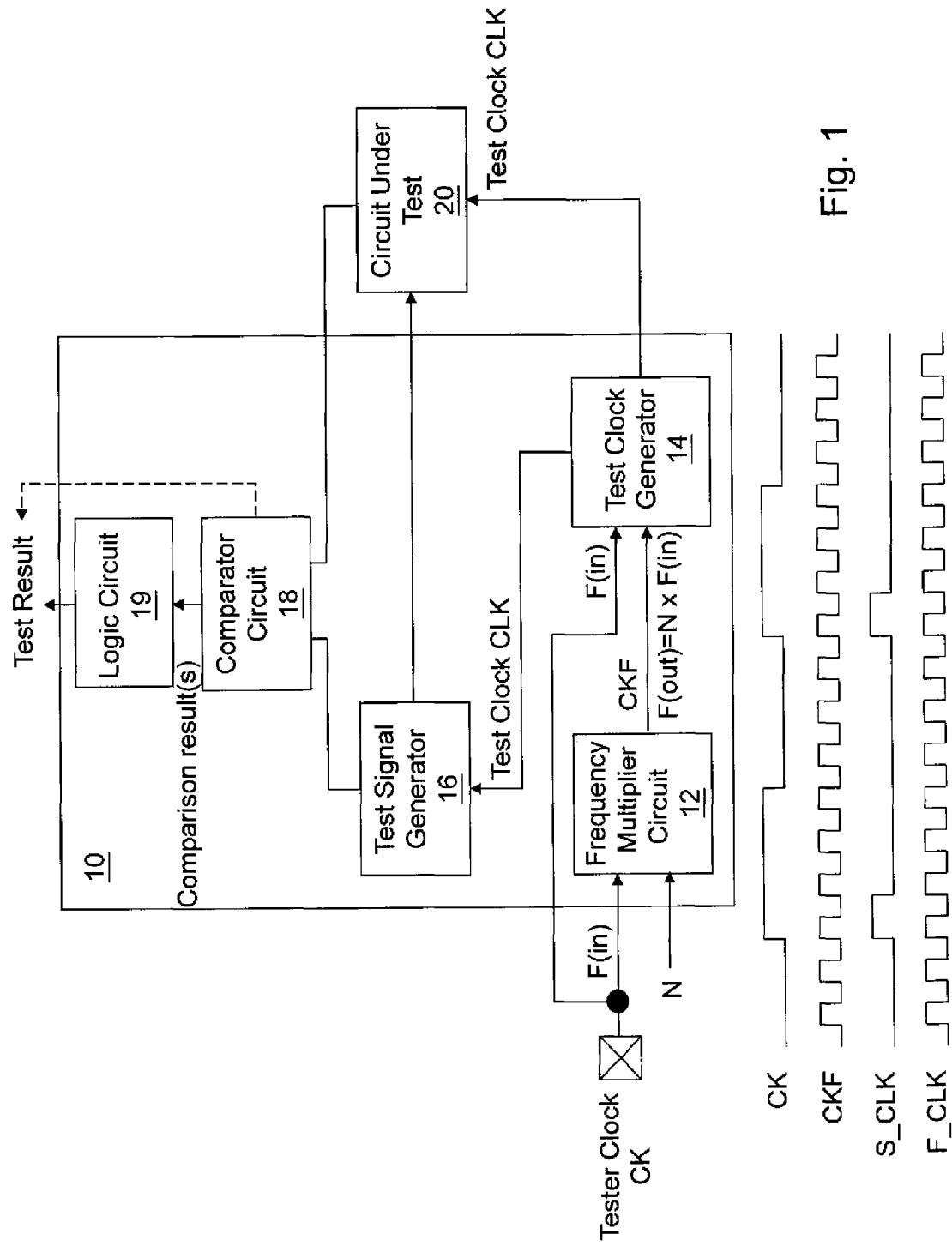
FIG. 1 illustrates a first embodiment of the present invention.

FIG. 1 shows the first embodiment of the present invention. The chip under test includes a circuit 20 under test, and an embedded high speed test circuit 10. The high speed test circuit 10 comprises an N-fold frequency multiplier circuit 12, a test clock generator 14, a test signal generator 16, a comparator circuit 18, and a logic circuit 19.

The frequency multiplier circuit 12 receives a clock CK from the tester, and outputs an N-fold frequency clock CKF. N is a positive real number, which is normally an integer but not necessarily so. N can be a constant, and in this case it can be directly designed in the circuit. Or, as shown in the figure, N can be a parameter set from the inside or outside of the circuit. The frequency multiplier circuit 12 can be embodied in various ways such as a PLL (Phase Lock Loop) or a DLL (Delay Lock Loop).

The test clock generator 14 receives the clock CKF outputted from the frequency multiplier circuit 12, and generates a test clock CLK which is sent to the test signal generator 16 and the circuit 20 under test. The test clock CLK is switchable between a high frequency clock F_CLK and a low frequency clock S_CLK. In this embodiment, the test clock CLK has the same frequency as the tester clock CK when it is switched to the low frequency clock S_CLK, and the test clock CLK has a frequency which is N-fold of the tester clock CK when it is switched to the high frequency clock F_CLK. Thus, the high speed test circuit 10 can conduct a test under high speed, while it also can be synchronized with the tester when it communicates with the tester. An example how the test clock generator 14 generates the low frequency clock S_CLK is shown in the figure. The test clock generator 14 receives the tester clock CK, and generates the low frequency clock S_CLK according to the rising edges of the tester clock CK. On the other hand, the high frequency clock F_CLK can be obtained from the output CKF of the frequency multiplier circuit 12. Certainly, the above example should not be taken as limitations to the present invention; there can be various other ways to generate high and low frequency clocks. For example, the tester clock CK can be directly taken as the low frequency clock. In another embodiment, the test clock generator 14 receives the high frequency clock CKF but not the tester clock CK, and it divides the frequency of the clock CKF to obtain the low frequency clock. There are more examples to be described later.

The test signal generator 16 generates a test signal according to the frequency of the test clock CLK from the test clock generator 14, and sends the test signal to the circuit 20 under test. The circuit 20 can be any type of circuit. As an example, a RAM will be discussed in the following description. However, the present invention is not limited to the application in memory circuits.

The circuit 20 under test will generate a response signal in response to the test signal. For example, if the circuit 20 under test is a DRAM (dynamic random access memory), the circuit 20 writes data into its memory cells after it receives a write command. Next, when the circuit 20 receives a read command, the data are read from the memory cells. The test signal generator 16 generates a corresponding signal, and the data and the corresponding signal are both inputted to the comparator circuit 18. The comparator circuit 18 compares the data with the corresponding signal and outputs comparison result(s). If the circuit 20 is another type of circuit rather than a memory, the response signal in response to the test signal may be different from the original test signal, and in this case the test signal generator 16 needs to generate a checking signal for comparison in addition to the test signal.

Under the foregoing configuration, assuming that the circuit 20 under test is a DRAM with X columns and Y rows, all bits in the same row can be accessed at a high speed, and when it is required to change the row address, the operation is allowed to be performed at a low frequency. Generally, data access of a DRAM requires high frequency operation, but the execution of a command is normally at lower frequency. According to the present application, if the circuit under test is a DRAM, the test clock can be switched to the high frequency to meet the requirement of the high speed column operation, and can be switched to the low frequency for the row operation as this does not affect the overall efficiency. However, the present invention is not limited to the application in DRAM. And if the present invention is applied to DRAM, it is not limited to performing the column operation at high frequency and the row operation at low frequency.

In one embodiment, the comparison result(s) generated from the comparator circuit 18 can be directly outputted to the exterior of the chip, as the test result. In another embodiment, if plural input/output (I/O) ports are under test, the logic circuit 19 executes a logic operation on the comparison results of the I/O ports. As an example of the logic operation, when all of the comparison results are correct, a signal representing "PASS" is outputted; when any comparison result is incorrect, a signal representing "FAIL" is outputted.

The forgoing embodiment is just one of the ways to conduct a test. That is, the signal generated from the circuit 20 under test is compared with the signal generated from the test signal generator 16. The application further provides another way to test the circuit 20, which can simplify the hardware and improve the test efficiency. Details will be explained later with reference to FIG. 5.

Figure 2:
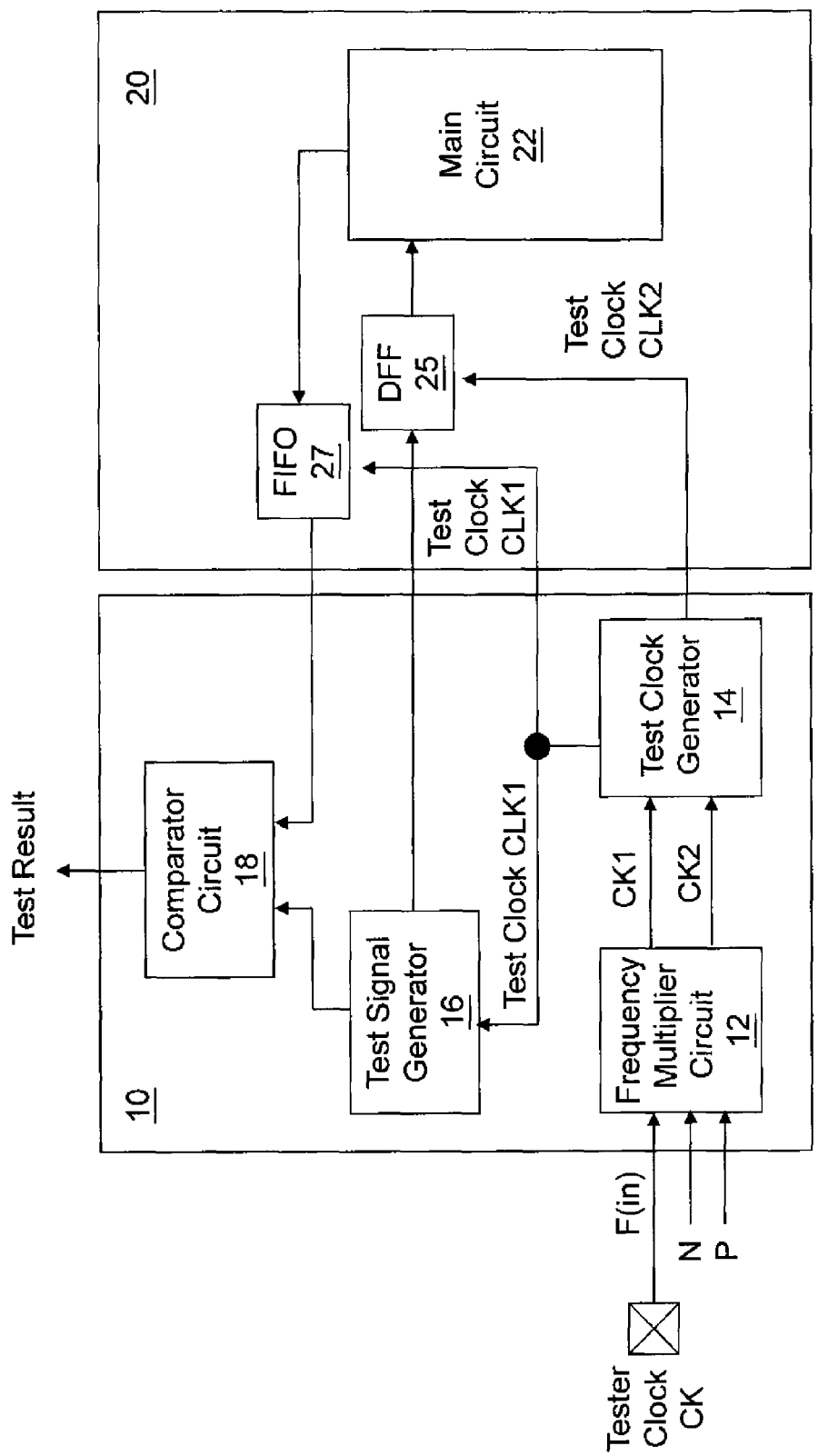
FIG. 2 illustrates a second embodiment of the present invention.

FIG. 2 illustrates the second embodiment of the present invention. In this embodiment, the frequency multiplier circuit 12 receives the clock CK from the tester, and outputs two N-fold frequency clocks CK1 and CK2. The frequencies of the two clocks are both N times of the frequency of the clock CK, but they have different phases. CK2 is behind CK1 for a certain delay interval. The delay interval for example can be determined by setting the parameter P. As one example, the periods of CK1 and CK2 are both T, and P is a number from 0 to 15, to determine an interval of (P/16) T between CK2 and CK1. This is just an example and there are many ways to set the delay interval other than setting the delay as a proportion of the period. For example, the parameter P can be used to set the actual delay interval. P can be a positive real number within a range determined by how it sets the delay interval. The purpose of setting the delay interval is to adjust a proper set-up time tS and a proper hold time for the data, which will be explained in more detail later.

In this embodiment, the circuit 20 under test comprises a main circuit 22, and also comprises a latch circuit 25 and a register 27. When the circuit 20 under test is a DRAM, the main circuit 22 for example is the memory cell array of the DRAM. The test clock generator 14 receives the outputs CK1 and CK2 from the frequency multiplier circuit 12, and generates test clocks CLK1 and CLK2. The aforementioned delay also interval exists between the test clocks CLK1 and CLK2. The test clock generator 14 sends the test clock CLK1 to the test signal generator 16 and the register 27. The register 27 for example may be a FIFO (First in First out) register, or any other type of register. The test clock CLK2 is sent to the latch circuit 25. The latch circuit 25 for example may be a D flip-flop DFF, or any other type of latch circuit. The test signal generated by the test signal generator 16 is written into the main circuit 22 through the latch circuit 25. On the other hand, the data read from the main circuit 22 is inputted to the comparator circuit 18 through the register 27, and is compared with the output of the test signal generator 16.

Under the foregoing configuration, the test signal generator 16 generates the test signal according to the test clock CLK1, but the latch circuit 25 samples the test signal and inputs the sampled signal to the main circuit 22 of the circuit 20 under test according to the test clock CLK2. Thus, the delay time between the test clocks CLK1 and CLK2 can be adjusted to ensure that data are written into the circuit 20 under test after the test signal has been properly set up, and there is sufficient hold time when the data are written into the circuit 20 under test. The test signal generator 16 and the register 27 preferably (but not necessarily) use the same clock, and their outputs are compared by the comparator circuit 18.

Note that the delay interval between the clock signals CLK1 and CLK2 can be set by other ways than from the delay interval between the outputs CK1 and CK2 of the frequency multiplier circuit 12. For example, like the first embodiment, the frequency multiplier circuit 12 can output only one clock signal CKF, and the test clock generator 14 generates the clock signals CLK1 and CLK2 according to the signal CKF and the parameter P.

Figure 3:
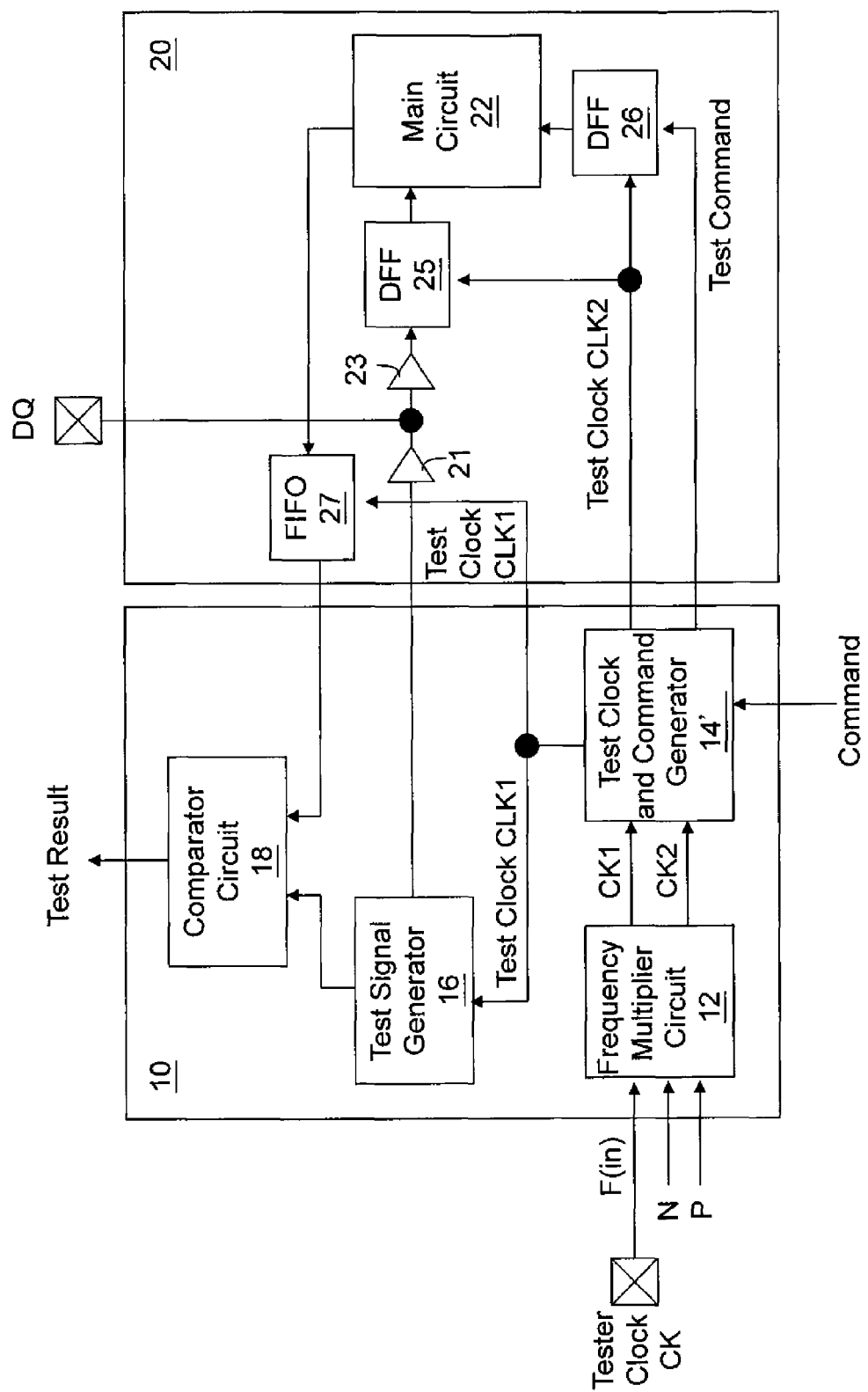
FIG. 3 illustrates a third embodiment of the present invention.

FIG. 3 illustrates the third embodiment of the present invention. In this embodiment, the test clock and command generator 14' not only can generate clocks, but also has the function of generating test commands. The test clock and command generator 14' receives a command from the exterior of the chip (e.g. from the tester), and transfers it into a test command which can be executed by the chip at a high speed. In addition, the test signal generated from the test signal generator 16 is transmitted to the exterior of the chip (e.g. to the tester) through the data pin DQ of the chip. The circuit 20 under test preferably has an output buffer 21 and an input buffer 23 in association with the data pin DQ. Furthermore, it also has a latch circuit 26 for receiving the command (e.g. the address of DRAM). The latch circuit 26 receives the second clock signal CLK2.

Figure 4:
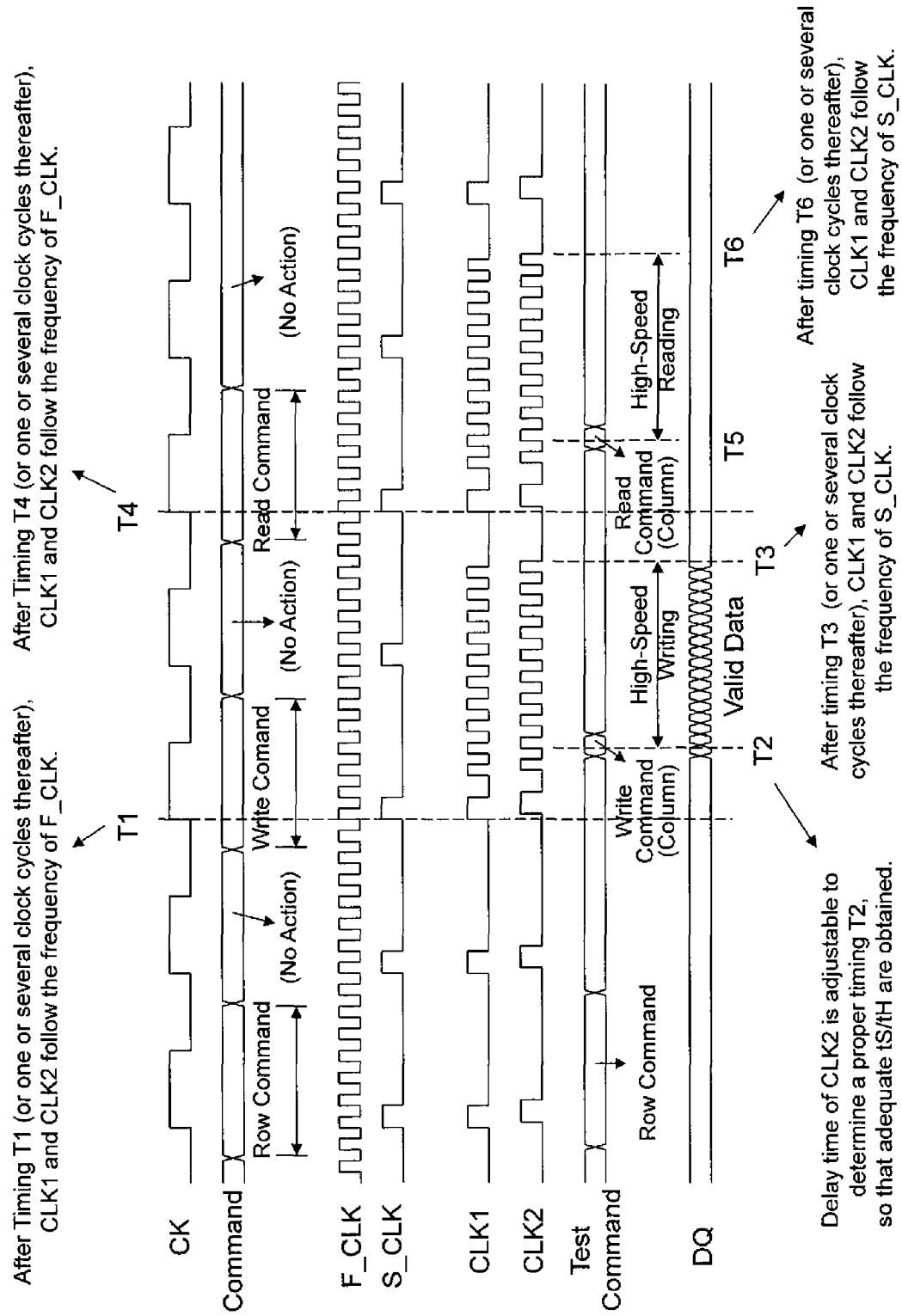
FIG. 4 shows a waveform diagram corresponding to the third embodiment.

Referring to FIGS. 3 and 4, and assuming that the circuit 20 under test is a DRAM, the circuit operates as follows. The clock CK and the command from the exterior of the chip are shown as the first and second waveforms in FIG. 4. The two signals are low frequency signals. According to the clock CK and the parameter N, the frequency multiplier circuit 12 generates N-fold frequency clocks CK1 and CK2. The waveform of the clock CK1 is shown as the third waveform F_CLK. The clock CK2 (not shown) is behind the clock CK1 for a certain delay interval determined by the parameter P.

The test clock and command generator 14' generates the low frequency signal S_CLK according to the clock CK (or according to the high frequency signal F_CLK, by frequency division), and generates the clocks CLK1 and CLK2 according to the clocks CK1 and CK2 and the low frequency signal S_CLK. The clock CLK2 is behind the clock CLK2 for a certain delay interval (i.e., there is a phase shift between them). The clock signals CLK1 and CLK2 are switchable between the frequency of the high frequency signal F_CLK and the frequency of the low frequency signal S_CLK. In addition, the test clock and command generator 14' transfers the command from the exterior of the chip into a test command which can be executed by the chip at a high speed. More specifically, when this command relates to a slow speed operation such as communication with the exterior of the chip, or for example when the circuit under test is a DRAM and the command relates to a row operation (as shown in the figure), the test clock and command generator 14' sets the clock signals CLK1 and CLK2 at a low frequency, and transmits the test command at the low frequency. On the other hand, when this command relates to a high speed operation such as an operation unrelated to the exterior of the chip, or for example when the circuit under test is a DRAM and the command relates to a column operation (as shown in the figure), referring to the timing T1 in FIG. 4, the test clock and command generator 14' switches the clock signals CLK1 and CLK2 to a high frequency. (In the shown embodiment, the frequency switching is delayed for one clock cycle of S_CLK to ensure that the signals are correct. This is just an example and the delay time, or even no delay, can be determined by a designer according to actual requirements.) The test command is also transferred into a high frequency signal. Thus, during the interval between timings T2 and T3, the "column write" operation is conducted at a high speed. After the write operation is completed (e.g. when a page is completely written), the test clock and command generator 14' changes the clock signals CLK1 and CLK2 back to the low frequency. Please note that the timing T2 is determined by the delay interval between the clock signals CLK1 and CLK2. In other words, a proper set-up time tS and a proper hold time tH can be ensured by setting a proper delay interval between the clock signals CLK1 and CLK2.

In addition, the specifications of the set-up time tS and the hold time tH can be detected according to the delay time between the clock signals CLK1 and CLK2 or a phase difference between them. The minimum set-up time tS indicates the minimum required time for the data to be ready before a rising edge of the clock signal, and the minimum hold time tH indicates the minimum required time to maintain the data after the rising edge of the clock signal. As shown in FIG. 4, the timing T2 can be determined by adjusting the delay interval or the phase difference between the clock signals CLK1 and CLK2. That is, if the delay interval is shorten to shift the timing T2 earlier, the set-up time tS is accordingly reduced. If the delay interval is increased to shift the timing T2 later, the hold time tH is accordingly reduced. In other words, the minimum set-up time tS can be detected by decreasing the delay interval and shifting the timing T2 earlier until the data test fails, and the specification of the set-up time tS can thus be obtained. The minimum hold time tH can be detected by increasing the delay interval and shifting the timing T2 later until the data test fails, and the specification of the hold time tH can thus be obtained.

At the timing T4, if the circuit finds that the external command is an operation executable under a high speed (such as a "column read" command in the shown embodiment), the test clock and command generator 14' switches the clock signals CLK1 and CLK2 to high frequency, and the test command is also transferred into a high frequency signal. Thus, during the interval between timings T5 and T6, the operation of "column read" can be conducted at a high speed. After the read operation is completed (e.g. when a page is completely read), the test clock and command generator 14' changes the clock signals CLK1 and CLK2 back to the low frequency.

When the circuit 20 under test is a DRAM (or other types of memories), usually the test does not require a complicated test signal pattern. Typically, the test signal pattern includes repeating data which are written into the circuit 20 under test, and read from the circuit 20 under test to confirm whether the data stored in the memory cells are correct. As such, whether the memory cells are defective can be detected. According to the present invention, if the test does not require a complicated test signal pattern, a simplified mechanism can be used to verify whether the data are correct. In the embodiments in FIGS. 1-3, the comparator circuit 18 compares the signal generated from the circuit 20 under test with the signal generated from the test signal generator 16; however, in the current embodiment, the comparator circuit 18 only needs to receive the signal generated from the circuit 20 under test, and it can verify the correctness of the data according to the aforementioned simplified mechanism. That is, the comparator circuit 18 does not need to receive the signal generated from the test signal generator 16. Thus, the processing speed can be improved to promote the test efficiency, and the hardware of the comparator circuit 18 can be simplified.

FIG. 5 is a schematic diagram illustrating the aforementioned data comparison mechanism of the present invention. During a page write cycle, the data D1-Dm are written into the circuit 20 under test. Then, the data d1-dm are read from the data stored in the circuit 20 under test during the page read cycle. In this embodiment, the written data D1-Dm include repeating n-bit data, that is, the data repeat for every n-bit length. That is, (D1, D2, D3, D4, ..., Dn)=(D(1+n), D(2+n), D(3+n), D(4+n), ..., D2n). According to the test requirement, n is given as an integer not less than 1. For example, n=1, 2, or 4. Because the written data D1-Dm include repeating n-bit data, the read data d1-dm also need to include repeating n-bit data. The comparator circuit 18 does not need to compare the written data with the read data bit by bit, but just checks whether the read data repeat according to a predetermined format. In this way, the time required for the comparison is reduced and the test efficiency is improved. As shown in the figure, during the read cycle, the read data (d1, d2, d3, d4, . . . , dn) are compared with the read data (d(1+n), d(2+n), d(3+n), d(4+n), . . . , d2n). If they are the same, the memory cells pass the test; otherwise, the memory cells may have defects.

In one embodiment, the user can test the circuit 20 under test multiple times according to repeating cycles of various lengths (e.g. n=1, 2, or 4). The value of n is settable from the exterior to the comparator circuit 18, as shown in FIG. 6A. The advantage of this embodiment is that the hardware of the comparator circuit 18 is simpler. In another embodiment, the comparator circuit 18 checks the data to determine the period of the repeating cycles by itself, as shown in FIG. 6B. The advantage of this embodiment is that the comparator circuit 18 does not need to get the value of n from its exterior, so a user does not need to input the parameter n.

As illustrated by the above, the advantages of the present invention include: a) even under the low speed limitation of the tester, most of the test operations can be conducted according to the highspeed capability of the chip; b) a proper data set-up time and a proper data hold time can be ensured by setting the delay interval between the clocks; c) the specifications of the set-up time and the hold time can be detected; d) the response signal can be verified by a simple circuit.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, in all the embodiments, the high speed circuit 10 is embedded in the chip under test, but the high speed circuit 10 can instead be a stand-alone chip. For another example, a device or circuit which does not affect the major functions of the signals can be added between two circuits illustrated to be directly connected with each other. As another example, FIG. 4 shows that the row operation and the column operation are respectively performed at a low frequency and a high frequency, but this is just an example to show that the clock frequency is switchable; row operation is not limited to being executed at low frequency and column operation is not limited to being executed at high frequency. The circuit 20 under test is not limited to a DRAM. Thus, the present invention should cover all such and other modifications and variations, which should be interpreted to fall within the scope of the following claims and their equivalents.

What is claimed is:

1. A high speed test circuit receiving a tester clock from a tester for conducting a test on a circuit under test, the high speed test circuit comprising:
an N-fold frequency multiplier circuit for receiving the tester clock and generating an N-fold frequency clock, wherein N is a positive real number;
a test clock generator for generating a test clock according to the N-fold frequency clock and the tester clock, wherein the test clock is switchable between a high frequency (high frequency test clock) and a low frequency (low frequency test clock);
a test signal generator operating under the test clock for generating a test signal to be sent to the circuit under test; and
a comparator circuit comparing the test signal from the test signal generator with a response signal provided by the circuit under test in response to the test signal, to generate a comparison result,
wherein the high speed test circuit tests the circuit under test according to the high frequency test clock, and performs a low speed operation according to the low frequency test clock.

2. The high speed test circuit of claim 1, wherein the low frequency test clock has the same frequency as the tester clock, and the high frequency test clock has the same frequency a the N-fold frequency clock.

3. The high speed test circuit of claim 1, wherein the comparison result generated by the comparator circuit is a multi-bit data, and the high speed test circuit further comprises a logic circuit coupled to the comparator circuit, for performing a logic operation on the multi-bit data to generate a test result.

4. The high speed test circuit of claim 1, wherein N is a constant, or is a parameter set internally within or externally outside the high speed test circuit.

5. The high speed test circuit of claim 1, wherein the test signal generator generates a first test clock and a second test clock with an adjustable delay time in between, and wherein the test signal generator generates the test signal according to the first test clock, but the test signal is sampled by the circuit under test according to the second test clock.

6. The high speed test circuit of claim 5, wherein the N-fold frequency multiplier circuit generates a first N-fold frequency clock and a second N-fold frequency clock with an adjustable delay time in between, and the test clock generator generates the first test clock and the second test clock according to the first N-fold frequency clock and the second N-fold frequency clock, respectively.

7. The high speed test circuit of claim 5, wherein the delay time is set by a parameter inputted from external of the high speed test circuit.

8. The high speed test circuit of claim 5, wherein the test signal generated from the test signal generator is sent to a latch circuit of the circuit under test, and the latch circuit conducts a sampling operation according to the second test clock.

9. The high speed test circuit of claim 5, wherein the circuit under test transmits the response signal to the comparator circuit according to the first test clock.

10. The high speed test circuit of claim 1, wherein the test signal generator receives an external command, and transfers the external command to a high frequency signal.

11. The high speed test circuit of claim 1, wherein the high speed test circuit and the circuit under test are integrated into a chip.

12. The high speed test circuit of claim 11, wherein the circuit under test is a DRAM, and the test clock is at the low frequency during a row operation and at the high frequency during a column operation.

13. The high speed test circuit of claim 11, wherein the test signal generated from the test signal generator includes repeating data streams, and the comparator circuit generates the comparison result by confirming whether the response signal has repeating data which repeat in a manner corresponding to the repeating data streams.

14. A high speed test method for conducting a test on a circuit under test, the method comprising:
receiving a tester clock from a tester;
generating an N-fold frequency clock according to the tester clock, wherein N is a positive real number;
generating a test clock according to the N-fold frequency clock and the tester clock, wherein the test clock is switchable between a high frequency (high frequency test clock) and a low frequency (low frequency test clock);

generating a test signal according to the frequency of the test clock;

sending the test signal to the circuit under test, for obtaining a response signal provided by the circuit under test in response to the test signal; and generating a test result according to the response signal.

15. The high speed test method of claim 14, wherein the low frequency test clock has the same frequency as the tester clock, and the high frequency test clock has the same frequency a the N-fold frequency clock.

16. The high speed test method of claim 14, wherein the step of generating a test result includes: generating a multi-bit data according to the response signal, and conducting a logic operation on the multi-bit data to generate the test result.

17. The high speed test method of claim 14, further comprising a step of setting a value of N.

18. The high speed test method of claim 14, wherein the step of generating the test signal includes generating a first test clock and a second test clock with an adjustable delay time in between, and wherein the step of generating the test signal generates the test signal according to the first test clock, and the step of sending the test signal to the circuit under test sends the test signal according to the second test clock.

19. The high speed test method of claim 18, wherein the step of generating an N-fold frequency clock generates a first N-fold frequency clock and a second N-fold frequency clock with an adjustable delay time in between.

20. The high speed test method of claim 18, further comprising a step of setting a parameter to determine the delay time.

21. The high speed test method of claim 14, further comprising steps of receiving an external command and transferring the external command to a high frequency signal.

22. The high speed test method of claim 14, wherein the circuit under test is a DRAM, and the test clock is at the low frequency during a row operation and at the high frequency during a column operation.

23. The high speed test method of claim 18, further comprising:

setting the delay time between the first test clock and the second test clock; and adjusting the delaying time to set the set-up time and the hold time of data in the circuit under test.

24. The high speed test method of claim 14, wherein the test signal generated from the test signal generator includes repeating data streams, and wherein the step of generating a comparison result further comprises: generating the comparison result by confirm whether the response signal has repeating data which repeat according to a predetermined format.

* * * * *